(12) United States Patent
Wang et al.

(10) Patent No.: US 12,261,227 B2
(45) Date of Patent: Mar. 25, 2025

(54) THIN FILM TRANSISTOR, DISPLAY SUBSTRATE AND DISPLAY DEVICE WITH REDUCED LEAKAGE CURRENT (71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Chenglong Wang, Beijing (CN); Yezhou Fang, Beijing (CN); Feng Li, Beijing (CN); Lei Yao, Beijing (CN); Lei Yan, Beijing (CN); Kai Li, Beijing (CN); Lin Hou, Beijing (CN); Xiaogang Zhu, Beijing (CN); Yun Gao, Beijing (CN); Yanzhao Peng, Beijing (CN); Teng Ye, Beijing (CN); Hua Yang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 429 days.

(21) Appl. No.: 17/772,785

(22) PCT Filed: May 21, 2021

(86) PCT No.: PCT/CN2021/095028
§ 371 (c)(1),
(2) Date: Apr. 28, 2022

(87) PCT Pub. No.: WO2022/001468
PCT Pub. Date: Jan. 6, 2022

(65) Prior Publication Data
US 2022/0406945 A1 Dec. 22, 2022

(30) Foreign Application Priority Data
Jun. 30, 2020 (CN) .................. 202010614083.9

(51) Int. Cl.
*H01L 29/786* (2006.01)
*G02B 27/01* (2006.01)
*H01L 29/417* (2006.01)

(52) U.S. Cl.
CPC .... *H01L 29/78696* (2013.01); *G02B 27/0172* (2013.01); *H01L 29/41733* (2013.01); *H01L 29/78633* (2013.01)

(58) Field of Classification Search
CPC ......... H01L 29/78696; H01L 29/41733; H01L 29/78633; H01L 29/42384
See application file for complete search history.

(56) References Cited

U.S. PATENT DOCUMENTS

2015/0062475 A1* 3/2015 Kim .................. H01L 29/4908
257/72
2019/0115478 A1* 4/2019 Sasagawa ........... H01L 29/7869
(Continued)

FOREIGN PATENT DOCUMENTS

CN 106229347 A 12/2016
CN 106684155 A 5/2017
(Continued)

OTHER PUBLICATIONS

Office Action dated Aug. 18, 2022 issued in corresponding Chinese Application No. 202010614083.9.

*Primary Examiner* — Nduka E Ojeh
(74) *Attorney, Agent, or Firm* — Nath, Goldberg & Meyer; Joshua B. Goldberg (57) ABSTRACT

The present disclosure provides a thin film transistor, a display substrate and a display device, and belongs to the field of display technology. The thin film transistor of the
(Continued)

present disclosure includes: a base, and a gate, an active layer, a source and a drain located on the base, where the gate includes a first gate and a second gate which are sequentially provided on the base and are electrically connected to each other; the active layer is located between the first gate and the second gate, and orthographic projections of the first gate and the second gate on the base are partially overlapped with an orthographic projection of the active layer on the base, and the orthographic projections of the first gate and the second gate on the base are partially overlapped with each other.

18 Claims, 6 Drawing Sheets

(56) References Cited

U.S. PATENT DOCUMENTS

| | | | |
|---|---|---|---|
| 2020/0057330 A1* | 2/2020 | Yamazaki | H10K 59/121 |
| 2021/0013238 A1* | 1/2021 | Suzuki | G02F 1/136227 |
| 2021/0091233 A1* | 3/2021 | Yang | H01L 29/78696 |
| 2023/0140193 A1* | 5/2023 | Choi | H10K 59/1213 |
| | | | 257/288 |

FOREIGN PATENT DOCUMENTS

| | | |
|---|---|---|
| CN | 110730984 A | 1/2020 |
| CN | 110931566 A | 3/2020 |

* cited by examiner

THIN FILM TRANSISTOR, DISPLAY SUBSTRATE AND DISPLAY DEVICE WITH REDUCED LEAKAGE CURRENT

This is a National Phase Application filed under 35 U.S.C. 371 as a national stage of PCT/CN2021/095028, filed May 21, 2021, an application claiming the benefit of Chinese Application No. 202010614083.9, filed Jun. 30, 2020, the content of each of which is hereby incorporated by reference in its entirety.

TECHNICAL FIELD

The present disclosure relates to the field of display technology, and in particular to a thin film transistor, a display substrate and a display device.

BACKGROUND

Since Virtual Reality (abbreviated as VR) display devices have characteristics of high resolution, fast response, high refresh frequency, high brightness backlight, high contrast, and the like, the market thereof is getting larger and larger, and the shipment volume thereof is increasing year by year.

In a manufacturing process of a thin film transistor used in an existing low-temperature polysilicon VR display device, a wet etching process is used to form a gate on a surface of a polysilicon material layer, and in such case, on the premise that a photoresist covered on a surface of the gate is not removed, the photoresist on the surface of the gate is used as a mask to perform ion implantation on the polysilicon material layer to form a source contact region and a drain contact region of an active layer, next, the photoresist on the surface of the gate is removed, and then a lightly doped drain (LDD) process is performed on the polysilicon material layer to form a lightly doped drain structure (i.e., an LDD structure).

It is found that due to a high electron mobility of the thin film transistor used in the conventional low-temperature polysilicon VR display device and an influence of high brightness backlight, a leakage current $I_{off}$ of a pixel where the thin film transistor is located is relatively large, which causes production yield of the low-temperature polysilicon VR display devices to be reduced.

SUMMARY

The present disclosure is directed to solve at least one of the problems in the related art, and provides a thin film transistor, a display substrate and a display device.

In a first aspect, an embodiment of the present disclosure provides a thin film transistor, which includes: a base, and a gate, an active layer, a source and a drain located on the base, where the gate includes a first gate and a second gate which are sequentially arranged on the base and are electrically connected to each other; the active layer is located between the first gate and the second gate, and orthographic projections of the first gate and the second gate on the base are partially overlapped with an orthographic projection of the active layer on the base; and the orthographic projections of the first gate and the second gate on the base are partially overlapped with each other.

In some implementations, a first gate insulating layer is provided between a layer where the first gate is located and a layer where the active layer is located, a second gate insulating layer is provided between the layer where the active layer is located and a layer where the second gate is located, a connection portion is provided on one of the first gate and the second gate, an orthographic projection of the connection portion on the base protrudes from an overlapping region in which the orthographic projections of the first gate and the second gate on the base overlap with each other;

the thin film transistor further includes a first via hole penetrating through the first gate insulating layer and the second gate insulating layer, and the connection portion electrically connects the first gate with the second gate through the first via hole.

In some implementations, the active layer includes a channel region, a source contact region and a drain contact region respectively provided at both sides of the channel region, and an ion doping concentration of the source contact region and an ion doping concentration of the drain contact region are both greater than that of the channel region.

In some implementations, an overlapping region in which orthographic projections of the active layer and the gate on the base overlap with each other is the channel region, the active layer further includes a first auxiliary region between the channel region and the source contact region and a second auxiliary region between the channel region and the drain contact region, orthographic projections of the first auxiliary region and the second auxiliary region on the base are not overlapped with an orthographic projection of the gate on the base, and ion doping concentrations of the first auxiliary region and the second auxiliary region are smaller than those of the source contact region and the drain contact region.

In some implementations, the ion doping concentrations of the first auxiliary region and the second auxiliary region are greater than or equal to the ion doping concentration of the channel region.

In some implementations, a light-shielding layer is provided on a side of the active layer close to the base, an orthographic projection of the light-shielding layer on the base is at least partially overlapped with the orthographic projection of the active layer on the base.

In some implementations, the light-shielding layer and the first gate are provided in a same layer and are made of a same material, where, the orthographic projections of the light-shielding layer and the first gate on the base substantially cover the orthographic projection of the active layer on the base.

In a second aspect, an embodiment of the present disclosure provides a display substrate, which includes pixel units arranged in an array, and each of the pixel units includes the thin film transistor described above.

In some implementations, a first gate insulating layer is provided between a layer where the first gate is located and a layer where the active layer is located, a second grate insulating layer is provided between the layer where the active layer is located and a layer where the second gate is located, first gates in the pixel units in a same row are connected to form a first gate bar, second gates in the pixel units in the same row are connected to form a second gate bar;

a second via hole penetrating through the first gate insulating layer and the second gate insulating layer is provided between any two adjacent pixel units in a row direction, and the first gate bar and the second gate bar in the pixel units in the same row are connected through second via holes.

In some implementations, a first gate insulating layer is provided between a layer where the first gate is located and a layer where the active layer is located; a second gate insulating layer is provided between the layer where the active layer is located and a layer where the second gate is located, the first gates in the pixel units in a same row are connected to form a first gate bar, the second gates in the pixel units in the same row are connected to form a second gate bar;

two ends of each first gate bar in an extension direction in which the first gate bar extends are respectively provided with a second via hole penetrating through the first gate insulating layer and the second gate insulating layer, the first gate bar is connected with the second gate bar, with an orthographic projection on the base being overlapped with that of the first gate bar on the base, through second via holes.

In some implementations, a connection portion is provided on one of the first gate and the second gate, an orthographic projection of the connection portion on the base protrudes from an overlapping region in which the orthographic projections of the first gate and the second gate on the base overlap with each other, the thin film transistor further includes a first via hole penetrating through the first gate insulating layer and the second gate insulating layer, and the connection portion electrically connects the first gate with the second gate through the first via hole;

any two adjacent connection portions in the row direction are respectively positioned on different sides, in the column direction, of the pixel units where the connection portions are respectively located.

In some implementations, a connection portion is provided on one of the first gate and the second gate, an orthographic projection of the connection portion on the base protrudes from an overlapping region in which the orthographic projections of the first gate and the second gate on the base overlap with each other, the thin film transistor further includes a first via hole penetrating through the first gate insulating layer and the second gate insulating layer, and the connection portion electrically connects the first gate with the second gate through the first via hole;

for any two adjacent pixel units, the connection portion is provided on the first gate in one of the two adjacent pixel units, and the connection portion is provided on the second gate in the other one of the two adjacent pixel units.

In a third aspect, an embodiment of the present disclosure provides a VR display device, which includes the display substrate described above.

DRAWINGS

FIG. 3b is a cross-sectional view taken along line A-A' of FIG. 3a;

FIG. 4b is a cross-sectional view taken along line B-B' of FIG. 4a;

FIG. 5b is a cross-sectional view taken along line C-C' of FIG. 5a;

FIG. 6b is a cross-sectional view taken along line D-D' of FIG. 6a;

FIG. 7b is a cross-sectional view taken along line E-E' of FIG. 7a;

Reference numerals: 10. base; 111. first gate; 112. second gate; 12. active layer; 13. source; 14. drain; 15. buffer layer; 16. first gate insulating layer; 17. second gate insulating layer; 18. first interlayer insulating layer; 19. second interlayer insulating layer; 20. light-shielding layer; 21. planarization layer; 22. pixel electrode; 23. third interlayer insulating layer; 24. common electrode; 100. first gate bar; 200. second gate bar; 30. connection portion; 40. first via hole; 50. second via hole; 60. photoresist pattern.

DETAILED DESCRIPTION

In order that those skilled in the art will better understand the technical solutions of the present disclosure, the following detailed description is given with reference to the accompanying drawings and the specific embodiments.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the words "a," "an," or "the" and similar referents do not denote a limitation of quantity, but rather denote the presence of at least one. The word "comprising" or "including", and the like, means that the element or item preceding the word includes the element or item listed after the word and its equivalent, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when the absolute position of the object being described is changed, the relative positional relationships may also be changed accordingly.

Before describing the thin film transistor, a method for manufacturing the thin film transistor, an array substrate, and a display device in the embodiments of the present disclosure, the following points are described.

In the embodiments of the present disclosure, a patterning process, such as a photolithographic patterning process, includes: coating a photoresist on a structural layer to be patterned, where the photoresist may be coated by a spin coating, blade coating or roller coating method; then, exposing the photoresist by using a mask plate, and developing the exposed photoresist to obtain a photoresist pattern; then etching the structural layer by using the photoresist pattern, and optionally removing the photoresist; finally, stripping off the residual photoresist to form a desired structure.

In the embodiments of the present disclosure, the "same layer" refers to that a film layer for forming specific patterns is formed first by using a single film-forming process and then layer structures are formed by performing a single patterning process on the film layer by using a same mask. Depending on the specific patterns, the single patterning process may include an exposure process, a development process, or an etching process, and the specific patterns formed in the same layer may be continuous or discontinuous, and may be at different heights or have different thicknesses.

In the embodiments of the present disclosure, the thin film transistor may be an N-type thin film transistor, or a P-type thin film transistor; the N-type thin film transistor refers to that N-type ion doping is carried out on the active layer of the thin film transistor; the P-type thin film transistor refers to that P-type ion doping is carried out on the active layer of the thin film transistor. A working level signal of the N-type thin film transistor (i.e., a level signal making the N-type thin film transistor to be turned on) is a high level signal; a working level signal of the P-type thin film transistor (i.e., a level signal making the P-type thin film transistor to be turned on) is a low level signal. In the following embodiments, the thin film transistor is described as the N-type thin film transistor as an example, but the present disclosure is not limited thereto.

The thin film transistor, the method for manufacturing the thin film transistor, the array substrate, and the display device in the embodiments of the present disclosure are described below with reference to the drawings, but the present disclosure is not limited to these specific embodiments.

Figure 1:
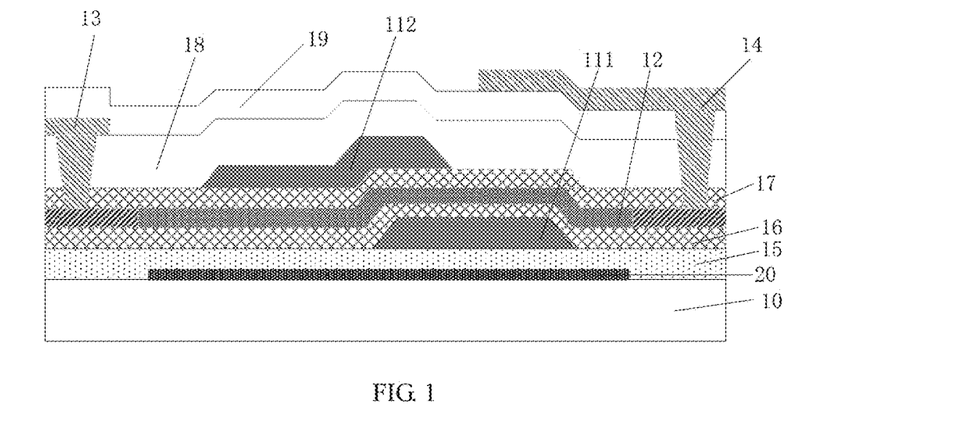
FIG. 1 is a cross-sectional view of a thin film transistor in an embodiment of the present disclosure.
Figure 2:
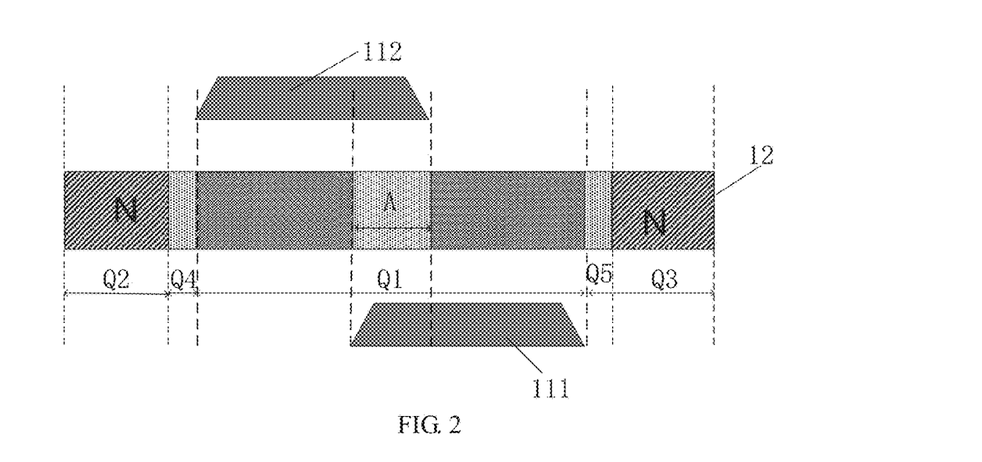
FIG. 2 is a schematic perspective view of a gate and an active layer of a thin film transistor in an embodiment of the present disclosure.

FIG. 1 is a cross-sectional view of a thin film transistor in an embodiment of the present disclosure; FIG. 2 is a schematic perspective view of a gate and an active layer of a thin film transistor in an embodiment of the present disclosure.

In a first aspect, as shown in FIGS. 1 and 2, an embodiment of the present disclosure provides a thin film transistor, including: a base 10, and a gate, an active layer 12, a source 13 and a drain 14 provided on the base; the thin film transistor in the embodiment of the present disclosure is specifically a dual-gate thin film transistor, and the gate of the thin film transistor specifically includes a first gate 111 and a second gate 112 that are sequentially provided on the base 10 and electrically connected to each other; a layer where the active layer 12 is located is located between a layer where the first gate 111 is located and a layer where the second gate 112 is located, and orthographic projections of the first gate 111 and the second gate 112 on the base 10 each are partially overlapped with an orthographic projection of the active layer 12 on the base 10; in particular, in the embodiment of the present disclosure, the orthographic projections of the first gate 111 and the second gate 112 on the base 10 partially overlap with each other.

It should be noted that, an overlapping region in which the orthographic projections of the gate and the active layer 12 on the base 10 overlap with each other defines a channel region Q1 of the active layer 12; in the embodiment of the present disclosure, the channel region Q1 of the active layer 12 is a region where the orthographic projections of the active layer 12, the first gate 111 and the second gate 112 on the base 10 overlaps with each other. Portions of the active layer 12 at two ends of the channel region Q1 are a source contact region Q2 and a drain contact region Q3 of the active layer 12, respectively. The source 13 and the drain 14 of the thin film transistor are connected to the source contact region Q2 and the drain contact region Q3 of the active layer 12, respectively. A first gate insulating layer 16 is provided between the layer where the first gate 111 is located and the layer where the active layer 12 is located; a second gate insulating layer 17 is provided between the layer where the active layer 12 is located and the layer where the second gate 112 is located. The first gate 111 and the second gate 112 may be electrically connected to each other through a first via hole 40 penetrating through the first gate insulating layer 16 and the second gate insulating layer 17.

In the thin film transistor of the embodiment of the present disclosure, since the first gate 111 and the second gate 112 are electrically connected to each other, when a high level signal is applied to one of the first gate 111 and the second gate 112, electric fields will be generated in the first gate insulating layer 16 and the second gate insulating layer 17, in such case, electric fluxlines in the first gate insulating layer 16 are directed from the first gate 111 to a lower surface of the active layer 12 (which is close to the base 10) and induced charges are generated on the lower surface of the active layer 12; electric fluxlines in the second gate insulating layer 17 are directed from the second gate 112 to an upper surface of the active layer 12 (which is away from the base 10), and induced charges are generated on the upper surface of the active layer 12. With the application of the high level signal to the first gate 111 and the second gate 112, the upper surface and the lower surface of the active layer 12 will transform from a depletion layer into an electron accumulation layer to form an inversion layer, when a strong inversion is reached (i.e., when a turn-on voltage is reached), carriers will pass through the active channel region Q1 of the active layer 12 when a voltage is applied between the source 13 and the drain 14, so that the thin film transistor is turned on. Meanwhile, it can be seen that, since the first gate 111 and the second gate 112 in the thin film transistor are respectively provided on the upper surface and the lower surface of the active layer 12, the thin film transistor has a higher electron mobility than a single-gate thin film transistor, and thus has better conduction performance.

In addition, in the thin film transistor in the embodiment of the present disclosure, the orthographic projections of the first gate 111 and the second gate 112 on the base 10 are partially overlapped, and since the electrical signals applied to the first gate 111 and the second gate 112 are the same, there is no electric field at an overlapping position at which the first gate 111 and the second gate 112 overlap with other, and therefore, there is no electric field in the overlapping region (i.e., the region A shown in FIG. 2) in which the orthographic projection of the active layer 12 on the base 10 overlaps with the orthographic projections of the first gate 111 and the second gate 112 on the base 10, and when the thin film transistor is turned off, since the active layer 12 has the A region, a leakage current of the thin film transistor can be effectively reduced.

In some implementations, a connection portion 30 is provided on one of the first gate 111 and the second gate 112, and at least a part of an orthogonal projection of the first via hole 40 penetrating through the first gate insulating layer 16 and the second gate insulating layer 17 on the base 10 falls within an orthogonal projection of the connection portion 30 on the base 10. It should be noted that the connection portion 30 may be a protrusion structure connected to the first gate 111 or the second gate 112, so that the orthographic projection of the connection portion on the base 10 protrudes from the overlapping region in which the orthographic projections of the first gate 111 and the second gate 112 on the base overlap with each other.

Specifically, when the connection portion 30 is provided on the first gate 111, the first gate 111 is connected to the connection portion 30, and the orthogonal projection of the connection portion 30 on the base 10 overlaps with the orthogonal projection of the second gate 112 on the base 10, for example, the orthographic projection of the connection portion 30 on the base 10 is covered by the orthographic projection of the second gate 112 on the base 10; the connection portion 30 is connected to the second gate 112 through the first via hole 40, so that the first gate 111 is connected with the second gate 112; when the connection portion 30 is provided on the second gate 112, the second gate 112 is connected to the connection portion 30, and the orthographic projection of the connection portion 30 on the base 10 overlaps with the orthographic projection of the first gate 111 on the base, for example, the orthographic projection of the connection portion 30 on the base 10 is covered by the orthographic projection of the first gate 111 on the base 10; the connection portion 30 is connected to the first gate 111 through a second via hole 50, so that the first gate 111 is connected to the second gate 112; the reason why the connection portion 30 is used to electrically connect the first gate 111 with the second gate 112 is that, in order to ensure the electron mobility of the thin film transistor, a size of the overlapping region in which the first gate 111 and the second gate 112 overlap with each other should not be too wide, and therefore, in order to make the first gate 111 and the second gate 112 electrically connected well, the connection portion 30 is provided to connect the first gate 111 and the second gate 112, thereby ensuring the electron mobility of the thin film transistor.

It should be noted that the first via hole 40 may be a metal via hole, that is, a metal layer is formed on a sidewall of the first via hole 40 to electrically connect the first gate 111, the connection portion 30, and the second gate 112 together; certainly, the first gate 111, the connection portion 30, and the second gate 112 may be electrically connected together by filling the first via hole 40 with a metal conductive material.

Figure 4A:
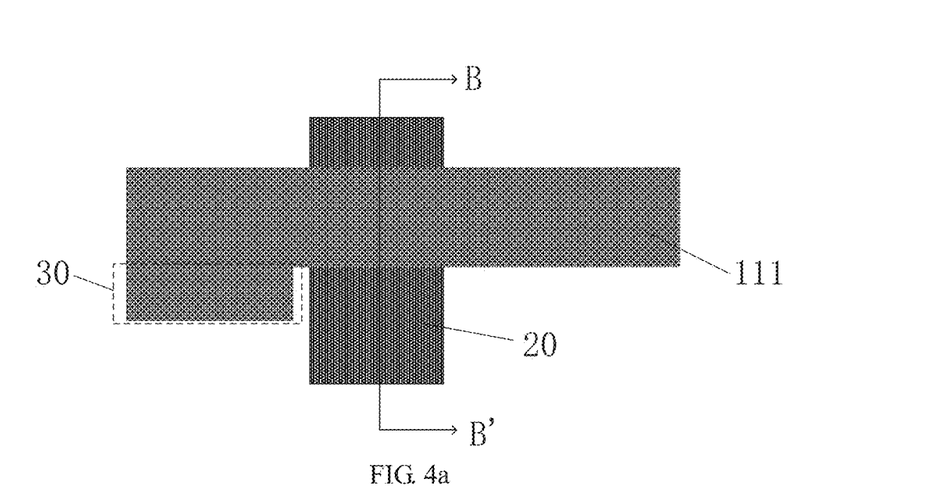
FIG. 4a is a top view of a first gate formed in a thin film transistor in an embodiment of the present disclosure.

In some implementations, in a case where the connection portion 30 is provided on the first gate 111, the first gate 111 and the connection portion 30 are formed into one piece, that is, the first gate 111 and the connection portion 30 are provided in a same layer and made of a same material, so that a pattern including the first gate 111 and the connection portion 30 can be formed in one patterning process. Similarly, in a case where the connection portion 30 is provided on the second gate 112, the second gate 112 and the connection portion 30 are formed into one piece, that is, the second gate 112 and the connection portion 30 are provided in a same layer and made of a same material, so that a pattern including the second gate 112 and the connection portion 30 can be formed in one patterning process. FIG. 4a is a top view of a first gate formed in a thin film transistor in an embodiment of the present disclosure, the embodiment of the present disclosure is described by taking the first gate 111 and the connection portion 30 shown in FIG. 4a are formed into one piece as an example.

In some implementations, the active layer 12 includes the channel region Q1 and the source contact region Q2 and the drain contact region Q3 respectively located at both ends of the channel region Q1. Ion doping concentrations of the source contact region Q2 and the drain contact region Q3 (i.e., concentrations of ions doped in the source contact region Q2 and the drain contact region Q3) are greater than that of the channel region Q1 (i.e., concentration of ions doped in the channel region Q1), so that the source contact region Q2 and the drain contact region Q3 of the active layer 12 are respectively in good ohmic contact with the source 13 and the drain 14 connected thereto. Specifically, the active layer 12 may be channel-doped for the first time to form the channel region after the pattern of the active layer 12 is formed, so as to adjust a threshold voltage Vth of the thin film transistor. After the pattern of the second gate 112 is formed, the source contact region Q2 and the drain contact region Q3 of the active layer 12 are heavily doped, so that the ion doping concentrations of the source contact region Q2 and the drain contact region Q3 of the active layer 12 are greater than that of the channel region Q1.

In some implementations, as shown in FIG. 2, the active layer 12 includes not only the channel region Q1, the source contact region Q2, and the drain contact region Q3 described above; but also a first auxiliary region Q4 between the channel region Q1 and the source contact region Q2, and a second auxiliary region Q5 between the channel region Q1 and the drain contact region Q3; it should be understood that the overlapping region in which the orthographic projections of the active layer 12 and the gate on the base 10 overlap with each other defines the channel region Q1 of the active layer 12, that is, the portion of the active layer 12 in the overlapping region in which the orthographic projections of the active layer 12, the first gate 111 and the second gate 112 on the base overlap with each other is the channel region Q1 of the active layer 12, and orthographic projections of the source contact region Q2, the drain contact region Q3, the first auxiliary region Q4 and the second auxiliary region Q5 of the active layer 12 on the base 10 are not overlapped with the orthographic projections of the first gate 111 and the second gate 112 on the base 10. Ion doping concentrations of the first auxiliary region Q4 and the second auxiliary region Q5 (i.e., concentrations of ions doped in the first auxiliary region Q4 and the second auxiliary region Q5) are smaller than the ion doping concentrations of the source contact region Q2 and the drain contact region Q3; therefore, the first auxiliary region Q4 and the second auxiliary region Q5 of the active layer 12 have semiconductor characteristics, and the first auxiliary region Q4 and the second auxiliary region Q5 are lightly doped (i.e., the first auxiliary region Q4 and the second auxiliary region Q5 are lightly doped again after the active layer 12 is channel-doped) compared with the source contact region Q2 and the drain contact region Q3, and simultaneously, the orthographic projections of the first auxiliary region Q4 and the second auxiliary region Q5 on the base 10 are not overlapped with the orthographic projections of the first gate 111 and the second gate 112 on the base 10, therefore, when the thin film transistor is turned off, since the active layer 12 has the first auxiliary region Q4 and the second auxiliary region Q5, the leakage current of the thin film transistor can be effectively reduced.

Certainly, the first auxiliary region Q4 and the second auxiliary region Q5 are channel-doped, i.e., the ion doping concentrations of the first auxiliary region Q4 and the second auxiliary region Q5 are the same as the ion doping concentration of the channel region Q1, that is, when the channel region Q1, the source contact region Q2 and the drain contact region Q3 of the active layer 12 are doped for the first time after the active layer 12 is formed, the first auxiliary region Q4 and the second auxiliary region Q5 are also lightly doped, so as to adjust the threshold voltage Vth of the thin film transistor.

Figure 3A:
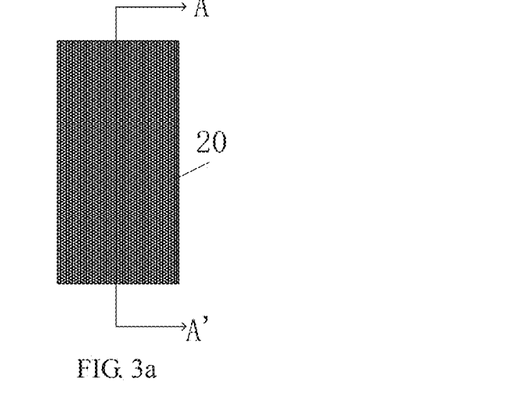
FIG. 3a is a top view of a light-shielding layer formed in a thin film transistor in an embodiment of the present disclosure.
Figure 3B:
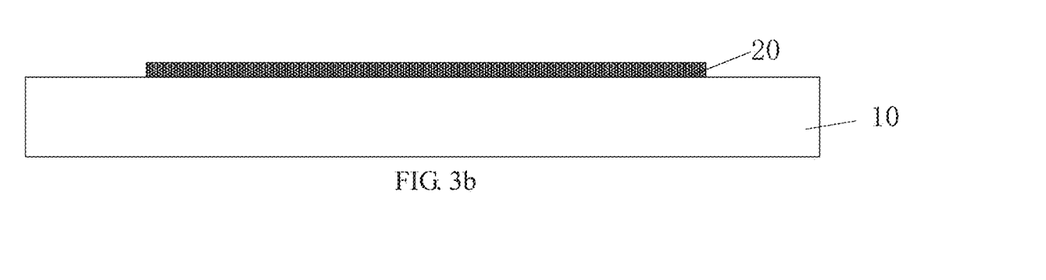

FIG. 3a is a top view of a light-shielding layer formed in a thin film transistor in an embodiment of the present disclosure, FIG. 3b is a cross-sectional view taken along line A-A' of FIG. 3a. In some implementations, as shown in FIG. 3a and FIG. 3b, in order to avoid light from irradiating the active layer 12 and causing a large leakage current of the thin film transistor, a light-shielding layer 20 is formed on a side of the active layer 12 close to the base 10, and an orthographic projection of the light-shielding layer 20 on the base 10 at least covers a portion of the channel region Q1 of the active layer 12.

In an example, the light-shielding layer 20 is provided on a side of the first gate 111 close to the base 10, a buffer layer 15 is provided between the light-shielding layer 20 and the first gate 111, and an orthographic projection of the light-shielding layer 20 on the base 10 completely covers the orthographic projection of the channel region Q1 of the active layer 12 on the base 10.

In another example, the light-shielding layer 20 may further be provided in the same layer as the first gate 111, and the orthogonal projections of the light-shielding layer 20 and the first gate 111 on the base 10 substantially completely cover the orthogonal projection of the channel region Q1 of the active layer 12 on the base 10. It should be noted that the reason why the orthographic projections of the light-shielding layer 20 and the first gate 111 on the base 10 substantially completely cover the orthographic projection of the channel region Q1 of the active layer 12 on the base 10 is that, a certain gap exists between the light-shielding layer 20 and the first gate 111, so as to avoid the light-shielding layer 20 and the first gate 111 being electrically connected to each other to affect the switching characteristics of the thin film transistor.

In order to make the layer structures of the thin film transistor in the embodiments of the present disclosure clearer, the thin film transistor in the embodiments of the present disclosure is further described with reference to the following method for manufacturing the thin film transistor.

An embodiment of the present disclosure provides a method for manufacturing a thin film transistor, which specifically includes the following steps S1 to S7.

At step S1, a base 10 is provided, and a pattern including a light-shielding layer 20 is formed on the base 10 through a patterning process, as shown in FIGS. 3a and 3b.

In some implementations, a material of the light-shielding layer 20 may be a light shielding metal material including, but not limited to, molybdenum (Mo). Taking the material of the light-shielding layer 20 as metal material Mo as an example, the step S1 may specifically include: the metal material Mo is deposited on the base 10, and a pattern including the light-shielding layer 20 is formed by performing exposure, development, and etching processes directly under a position corresponding to the channel region Q1 of the active layer 12 to be formed.

In the embodiment of the present disclosure, the base 10 is a transparent insulating base 10, and a material of the base 10 includes, but is not limited to, glass and quartz, and other suitable materials may also be used.

Figure 4B:
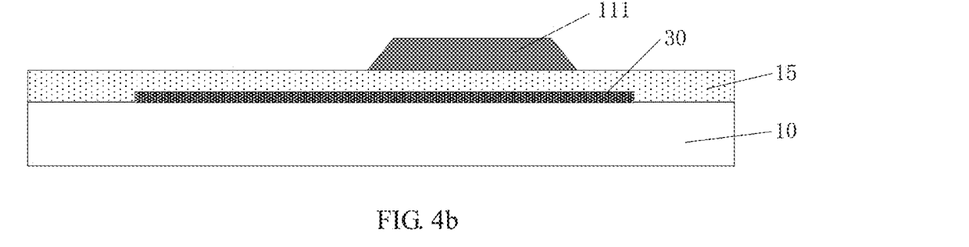

At step S2, a buffer layer 15 is formed on the base 10 on which the light-shielding layer 20 has been formed, and a pattern including a first gate 111 of a gate is formed on a side of the buffer layer 15 away from the base 10 through a patterning process, as shown in FIGS. 4a and 4b, where FIG. 4a is a top view of the first gate 111 formed in the thin film transistor in the embodiment of the present disclosure, and FIG. 4b is a cross-sectional view taken along line B-B' of FIG. 4a.

In the embodiment of the present disclosure, a material of the buffer layer 15 may be selected from materials having lattice structure similar to that of silicon (Si), such as silicon nitride ($Si_xN_y$) or silicon oxide ($Si_xO_y$). Specifically, the buffer layer 15 may be a single-layer structure of silicon nitride or silicon oxide, or may be a composite film structure of silicon nitride and silicon oxide.

The first gate 111 may be made of a conductive material such as Molybdenum (Mo), molybdenum niobium alloy, aluminum (Al), aluminum neodymium alloy, titanium (Ti) or copper (Cu). The first gate 111 may be a single-layer structure or a multi-layer structure, such as a three-layer structure of Ti/Al/Ti.

In some implementations, the step S2 may specifically include: forming the buffer layer 15 on the base 10 formed with the light-shielding layer 20 by means including, but not limited to, a deposition process, so as to provide a thermal insulation layer and a heat conduction layer when the active layer 12 is subsequently annealed; forming a first gate metal material layer on the base 10 on which the buffer layer 15 has been formed, and then forming a pattern including the first gate 111 and the connection portion 30 through exposure, development and etching processes.

Figure 5A:
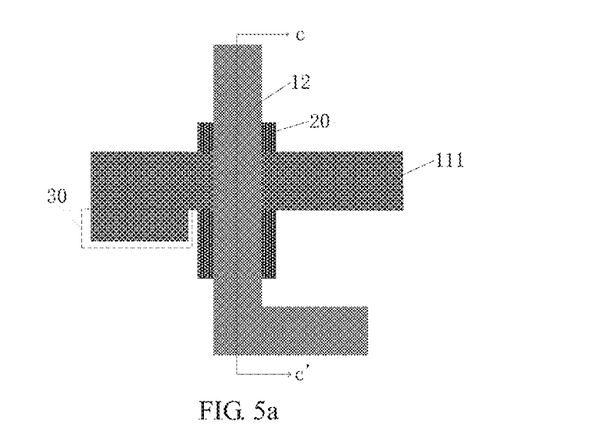
FIG. 5a is a top view of an active layer formed in a thin film transistor in an embodiment of the present disclosure.
Figure 5B:
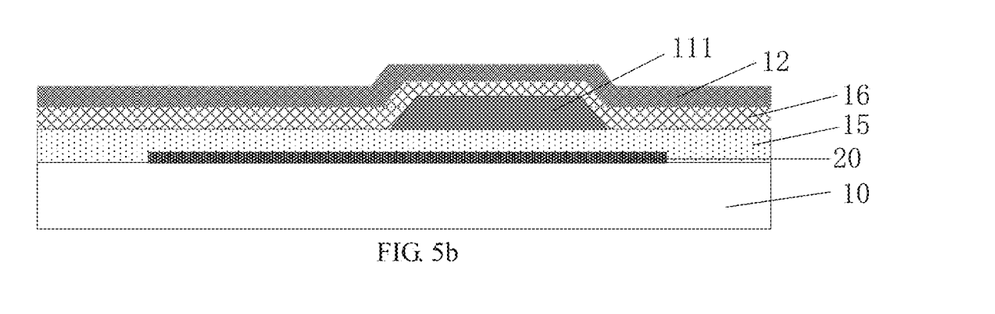

At step S3, a first gate insulating layer 16 is formed on the base 10 on which the first gate 111 has been formed, and a pattern including the active layer 12 is formed on a side of the first gate insulating layer 16 away from the base 10 through a patterning process, as shown in FIGS. 5a and 5b, where FIG. 5a is a top view of the active layer in the thin film transistor in the embodiment of the present disclosure, and FIG. 5b is a cross-sectional view taken along line C-C' of FIG. 5a.

In the embodiment of the present disclosure, a material of the first gate insulating layer 16 may be selected from materials having a lattice structure similar to that of silicon (Si), such as silicon nitride ($Si_xN_y$) or silicon oxide ($Si_xO_y$). Specifically, the first gate insulating layer 16 may be a single-layer structure of silicon nitride or silicon oxide, or may be a composite film structure of silicon nitride and silicon oxide.

In the embodiment of the present disclosure, a material of the active layer 12 is amorphous silicon, polysilicon, an oxide semiconductor or the like. The polysilicon may be high-temperature polysilicon or low-temperature polysilicon, and the oxide semiconductor may be indium gallium zinc oxide (IGZO), indium zinc oxide (IZO), zinc oxide (ZnO), gallium zinc oxide (GZO), or the like. In the embodiment of the present disclosure, the active layer 12 being made of the low-temperature polysilicon is taken as an example.

In some implementations, the step S3 may specifically include: firstly, sequentially forming the first gate insulating layer and an amorphous silicon film (a-Si) by a deposition method, where the deposition method includes a plasma enhanced chemical vapor deposition method and a low-pressure chemical vapor deposition method.

Then, the amorphous silicon film is crystallized by a crystallization method, the crystallization method includes: converting the amorphous silicon film into a polysilicon film (P-Si) by using an excimer laser crystallization method, a metal induced crystallization method, or a solid-phase crystallization method, and then doping (P-type doping or N-type doping) the polysilicon film (P-Si) to determine conductivity type of the channel region Q1 of the thin film transistor. In the embodiment, description is made by taking the N-type transistor as an example, therefore, the N-type doping is performed on the polysilicon film herein. In this step, the amorphous silicon film is channel-doped, and specifically, 3-valent boron ions may be doped. Here, it should be noted that, since the concentration of ions doped in the amorphous silicon film determines the threshold voltage Vth of the thin film transistor, the concentration of the ions to be doped may be adjusted in accordance with the threshold voltage Vth of the thin film transistor.

In addition, the excimer laser crystallization method and the metal induced crystallization method adopted in this step are two low-temperature polysilicon methods, which are common methods for converting the amorphous silicon into polysilicon. However, the method of converting amorphous silicon into polysilicon in the present disclosure is not limited to the low-temperature polysilicon method, as long as the active layer 12 can be converted into a desired polysilicon thin film.

Finally, a layer of photoresist is formed on the polysilicon film, the photoresist is exposed and developed, and then the polysilicon film is dry-etched to form the pattern including the active layer 12.

Figure 6A:
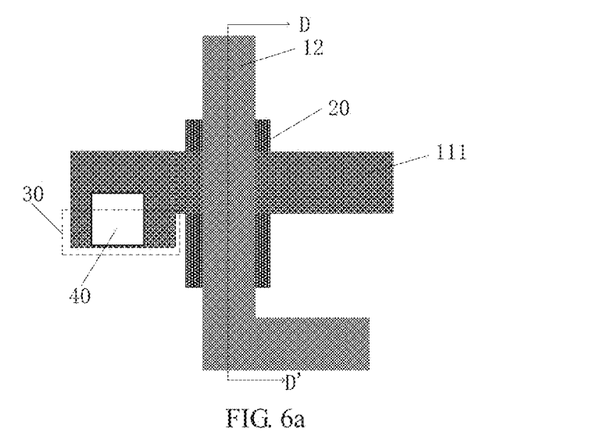
FIG. 6a is a top view of a first via hole formed in a thin film transistor in an embodiment of the present disclosure.
Figure 6B:
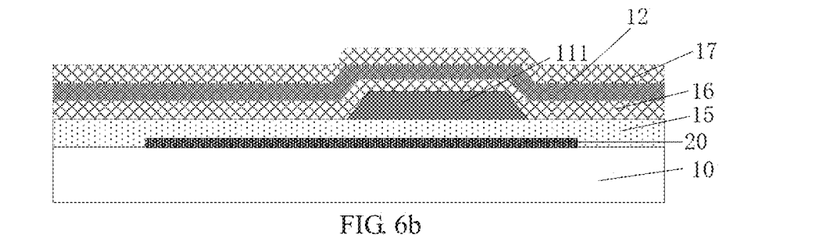

At step S4, a second gate insulating layer 17 is formed on the base 10 on which the active layer 12 has been formed, and a first via hole 40 penetrating through the first gate insulating layer 16 and the second gate insulating layer 17 is formed in portions of the first gate insulating layer 16 and the second gate insulating layer 17 corresponding to the connection portion 30, so that a second gate 112 to be subsequently formed can be connected to the connection portion 30 through the first via hole 40, and thus the first gate 111 is connected with the second gate 112, as shown in FIGS. 6a and 6b, where FIG. 6a is a top view of the first via hole in the thin film transistor in the embodiment of the present disclosure, and FIG. 6b is a cross-sectional view taken along line D-D' of FIG. 6a.

A material of the second gate insulating layer 17 may be the same as the material of the first gate insulating layer 16, and thus, the material of the second insulating layer will not be described herein.

In some implementations, the step S4 may specifically include: depositing the second gate insulating layer 17, and forming the first via hole 40 penetrating through the first gate insulating layer 16 and the second gate insulating layer 17 in portions of the first gate insulating layer 16 and the second gate insulating layer 17 corresponding to the connection portion 30 through exposure, development, and etching processes.

Figure 7A:
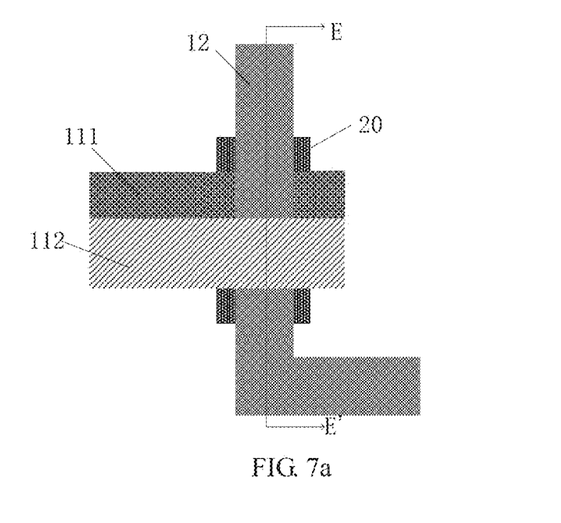
FIG. 7a is a top view of a second gate formed in a thin film transistor in an embodiment of the present disclosure.
Figure 7B:
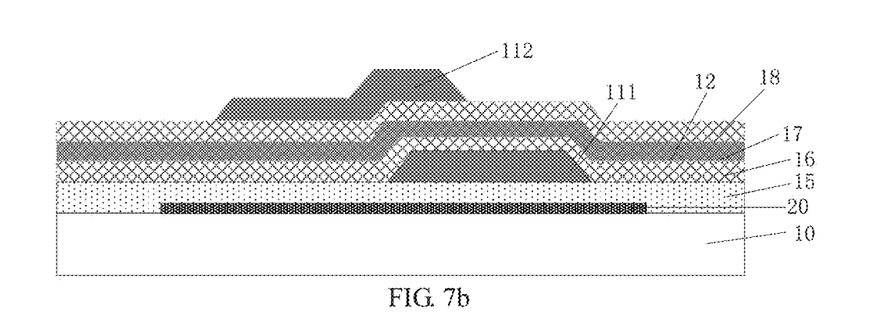

At step S5, a pattern including the second gate 112 is formed on the base 10 on which the second gate insulating layer 17 has been formed through a patterning process, where the formed second gate 112 is connected to the connection portion 30 through the first via hole 40, and an orthographic projection portion of the second gate 112 on the base partially overlaps with an orthographic projection of the first gate 111 on the base 10, as shown in FIGS. 7a and 7b, where FIG. 7a is a top view of a second gate in a thin film transistor in an embodiment of the present disclosure, and FIG. 7b is a cross-sectional view taken along line E-E' of FIG. 7a.

A material and a manufacturing process of the second gate 112 may be the same as those of the first gate 111, and therefore, the forming process of the second gate 112 will not be described herein.

At step S6, ion implantation (i.e., heavy doping) is performed on a source contact region Q2 and a drain contact region Q3 of the active layer 12 on the base 10 on which the second gate 112 has been formed, so as to enhance ohmic contact of the active layer 12 with a source 13 and a drain 14, and ensure good ohmic contact of the P-Si with the source 13 and the drain 14.

Figure 8:
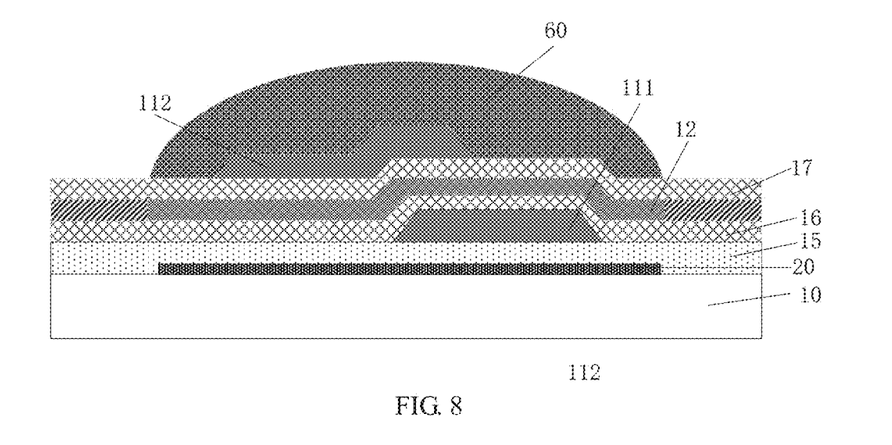
FIG. 8 is a schematic diagram illustrating ion doping of a source contact region and a drain contact region of a thin film transistor in an embodiment of the present disclosure.

In some implementations, the step S6 may specifically include: forming a photoresist layer on a side of the second gate 112 away from the base 10, and exposing the photoresist layer to form a photoresist pattern 60, then performing ion implantation, by using the photoresist pattern 60 as a mask for the source contact region Q2 and the drain contact region Q3 of the active layer 12, on the source contact region Q2 and the drain contact region Q3 of the active layer 12, i.e., performing heavily doping on the source contact region Q2 and the drain contact region Q3 of the active layer 12 by using, but not limited to, 5-valent phosphorus ions to enhance ohmic contact of the active layer 12 with the source 13 and the drain 14, as shown in FIG. 8, where FIG. 8 is a schematic diagram illustrating ion doping of the source contact region and the drain contact region of the thin film transistor in the embodiment of the present disclosure.

In addition, in some implementations, a width of the photoresist pattern is greater than a line width of the gate formed by the first gate 111 and the second gate 112, so that after the source contact region Q2 and the drain contact region Q3 are heavily doped, portions of the active layer 12 between the channel region Q1 and the source contact region Q2 and between the channel region Q1 and the drain contact region Q3 are not heavily doped, which are a first auxiliary region Q4 and a second auxiliary region Q5, respectively; the first auxiliary region Q4 and the second auxiliary region Q5 are both implanted with only 3-valent boron ions, and orthographic projections of the first auxiliary region Q4 and the second auxiliary region Q5 on the base 10 are not overlapped with the orthographic projections of the first gate 111 and the second gate 112 on the base 10, so that the first auxiliary region Q4 and the second auxiliary region Q5 are lightly doped structures, and thus the leakage current can be effectively reduced, as shown in FIG. 2. It should be noted that the first auxiliary region Q4 and the second auxiliary region Q5 may only be doped once during the active layer being channel-doped to form the channel region, or may also be lightly doped after the heavy doping, and the ion doping concentrations of the first auxiliary region Q4 and the second auxiliary region Q5 depend on desired switching characteristics of the thin film transistor.

The method for ion implantation includes an ion implantation method with a mass analyzer, an ion cloud implantation method without a mass analyzer, a plasma implantation method, or a solid diffusion implantation method. That is, in the present embodiment, the active layer 12 with relatively good semiconductor properties is finally formed by performing multiple steps, such as crystallization, doping, ion implantation, on the low-temperature polysilicon material.

At step S7, as shown in FIG. 1, after the source contact region Q2 and the drain contact region Q3 of the active layer 12 are heavily doped, a first interlayer insulating layer 18 is formed on the base 10 on which the second gate 112 has been formed, and exposing, developing and etching are performed on portions of the first interlayer insulating layer 18 and the second gate insulating layer 17 corresponding to the source contact region Q2 to form a source contact via hole penetrating through the first interlayer insulating layer 18 and the second gate insulating layer 17; then, a pattern including the source 13 is formed through a patterning process, where the source 13 is connected with the source contact region Q2 through the source contact via hole; next, a second interlayer insulating layer 19 is formed on the base 10 on which the source 13 has been formed, and exposing, developing and etching are performed on portions of the second interlayer insulating layer 19, the first interlayer insulating layer 18 and the second gate insulating layer 17 corresponding to the drain contact region Q3 to form a drain contact via hole penetrating through the second interlayer insulating layer 19, the first interlayer insulating layer 18 and the second gate insulating layer 17; and a pattern including the drain 14 is then formed through a patterning process, and the drain 14 is connected to the drain contact region Q3 through the drain contact via hole.

It should be noted that the source 13 and the drain 14 formed in the step S7 are of a layered structure, that is, the source 13 and the drain 14 are formed in two layers, where an order of manufacturing the source 13 and the drain 14 may be exchanged, and in the embodiment of the present disclosure, description is made by taking a case where the drain 14 is formed above the source 13 as an example, in such way, the size of the thin film transistor can be reduced, which is beneficial to improving an aperture ratio of the display substrate including the thin film transistor; certainly, it is also feasible to form the source 13 and the drain 14 of the thin film transistor in a same layer through a single patterning process.

In some implementations, when the source contact via hole penetrating through the first interlayer insulating layer 18 and the second gate insulating layer 17 is formed, an activation hydrogenation process may be performed to repair the crystal lattice of the active layer 12.

Materials of the first interlayer insulating layer 18 and the second interlayer insulating layer 19 formed in the step S7 may be the same as the material of the first gate insulating layer 16, and thus, the description thereof is not repeated herein. The materials and the manufacturing processes of the source 13 and the drain 14 are the same as those of the gate, and thus the description thereof is not repeated herein.

So far, the manufacturing of the thin film transistor in the embodiment of the present disclosure is completed.

In a second aspect, an embodiment of the present disclosure provides a display substrate, where the display substrate may be used in a VR display device, and the display substrate includes pixel units arranged in an array, where each pixel unit may include any one of the thin film transistors described above.

Since the display substrate in the embodiment of the present disclosure includes any one of the thin film transistors described above, the leakage current of the thin film transistor is relatively small, and the performance of the display substrate is relatively good.

Figure 9:
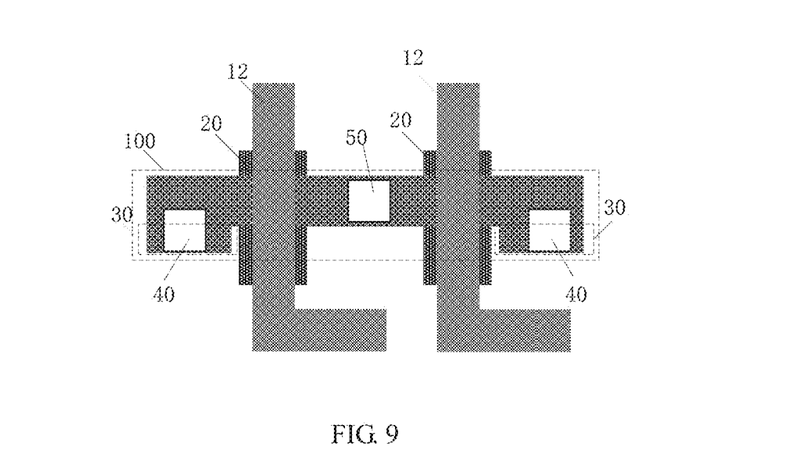
FIG. 9 is a schematic diagram of a second via hole provided in a display substrate in an embodiment of the present disclosure.
Figure 10:
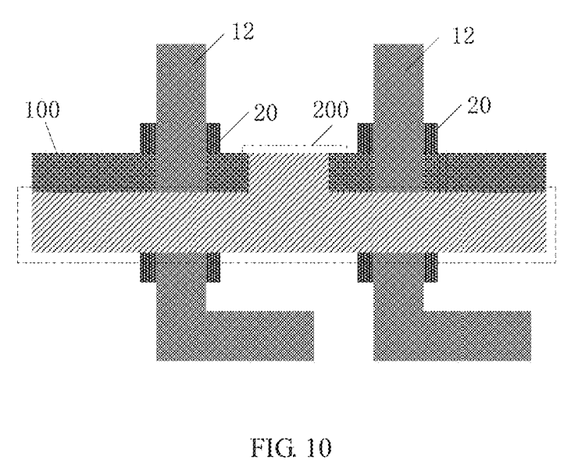
FIG. 10 is a schematic diagram of a second gate bar in a display substrate in an embodiment of the present disclosure.

FIG. 9 is a schematic diagram of a second via hole 50 provided in a display substrate in an embodiment of the present disclosure, FIG. 10 is a schematic diagram of a second gate bar 200 in the display substrate in the embodiment of the present disclosure, as shown in FIGS. 9 and 10, in each thin film transistor, the first gate insulating layer 16 is provided between the layer where the first gate 111 is located and the layer where the active layer 12 is located, and the second gate insulating layer 17 is provided between the layer where the active layer 12 is located and the layer where the second gate 112 is located; where, the first gates 111 of the thin film transistors in the pixel units in a same row are connected to form a first gate bar 100; the second gates 112 of the thin film transistors in the pixel units in a same row are connected to form a second gate bar 200. A second via hole 50 penetrating through the first gate insulating layer 16 is provided between any two adjacent pixel units; the first gate bar 100 and the second gate bar 200 located in the pixel units in a same row are electrically connected through the second via holes 50. The second via holes 50 penetrating through the first gate insulating layer 16 are provided between any two adjacent pixel units, so as to ensure that the first gate bar 100 and the second gate bar 200 are electrically connected well, so that the first gate bar 100 and the second gate bar 200 are input with a same electrical signal when a scanning signal is input. Meanwhile, in the embodiment of the present disclosure, since the second via hole 50 and the first via hole 40 electrically connecting the first gate 111 with the second gate 112 both penetrate through the first gate insulating layer 16, the first via hole 40 and the second via hole 50 may be formed in a single patterning process, which does not increase the number of process steps.

Certainly, the second via holes 50 penetrating through the first gate insulating layer 16 and the second gate insulating layer 17 may be formed only at two ends of the first gate bar 100 and the second gate bar 200, so as to electrically connect the first gate bar 100 and the second gate bar 200, and in such case, the scanning signal may be introduced from two ends of the first gate bar 100 and the second gate bar 200, which may help to enhance the toughness of the substrate by achieving the electrical connection between the first gate bar 100 and the second gate bar 200 through fewer via holes.

In some implementations, as shown in FIG. 9, for the thin film transistor in each pixel unit, the connection portion 30 is provided on one of the first gate III and the second gate 112, and the first via hole 40 penetrating through the first gate insulating layer 16 and the second gate insulating layer 17 electrically connects the first gate 111 with the second gate 112 through the first connection portion 30. In the embodiment of the present disclosure, one connection portion 30 is provided on the first gate 111 of one of the thin film transistors in any two adjacent pixel units in the same row, and another connection portion 30 is provided on the second gate 112 of the other one of the thin film transistors in the any two adjacent pixel units in the same row, so that the scanning signals input to the first gates 111 and the second gates 112 in the same row are kept consistent. Certainly, it is also possible to provide the connection portion 30 on the first gate 111 in each of the pixel units in a first row, and provide the connection portion 30 on the second gate 112 in each of the pixel units in a second row adjacent to the first row, which falls within the protection scope of the embodiment of the present disclosure.

In addition, the connection portions 30 in any two adjacent pixel units in the row direction are located at different sides of the respective pixel units in a column direction, for example, the connection portion 30 in a first pixel unit is located at the left side of the first pixel unit, and the connection portion 30 in a second pixel unit adjacent to the first pixel unit in the row direction is located at the right side of the second pixel unit. Certainly, the connection portions 30 in the pixel units may be located on a same side of the pixel units in the column direction, which falls within the scope of the embodiments of the present disclosure.

Figure 11:
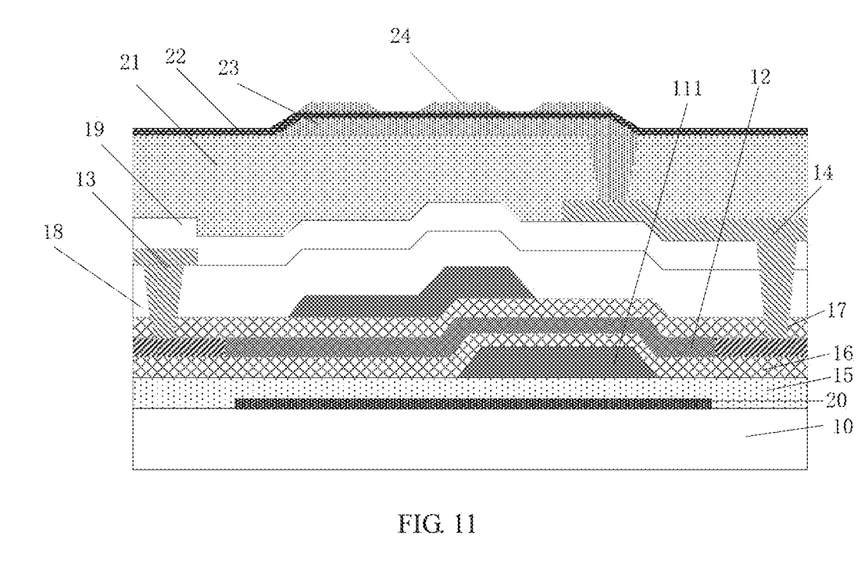
FIG. 11 is a schematic diagram of a display substrate in an embodiment of the present disclosure.

FIG. 11 is a schematic diagram of a display substrate in an embodiment of the present disclosure, and as shown in FIG. 11, a pixel electrode 22 and a common electrode 24 are further provided in each of the pixel units on the display substrate. In some implementations, a planarization layer 21 is provided on a side of a layer, where the drain 14 of the thin film transistor is located, away from the base 10, a third via hole is formed in a portion of the planarization layer 21 corresponding to the drain 14, and the pixel electrode 22 is formed on a side of the planarization layer 21 away from the base 10 and is connected to the drain 14 of the thin film transistor through the third via hole. A third interlayer insulating layer 23 is provided on a side of a layer, where the pixel electrode 22 is located, away from the base 10, and the common electrode 24 may be further provided on a side of the third interlayer insulating layer 23 away from the base 10. The pixel electrode 22 is a plate electrode, and the common electrode 24 is a slit electrode. Certainly, in a case where both the pixel electrode 22 and the common electrode 24 are provided on the display substrate, both the pixel electrode 22 and the common electrode 24 may be slit electrodes. In a case where the pixel electrode 22 and the common electrode 24 are both slit electrodes, they may be provided in a same layer, or may be provided in different layers, as long as they are alternately provided. In the embodiment of the present disclosure, the common electrode 24 may not be provided on the display substrate, and may be provided on an opposite substrate opposite to the display substrate, where the opposite substrate in the embodiment of the present disclosure includes, but is not limited to, a color filter substrate.

In a third aspect, an embodiment of the present disclosure provides a display device, which includes the display substrate described above. The display device in the embodiment of the present disclosure includes, but is not limited to, a VR display device. Since the thin film transistor in the display panel of the display device adopts the thin film transistor described above, the leakage current is relatively small, and the display effect is better.

It will be understood that the above embodiments are merely exemplary embodiments employed to illustrate the principles of the present disclosure, and the present disclosure is not limited thereto. It will be apparent to those skilled in the art that various changes and modifications may be made therein without departing from the spirit and scope of the present disclosure, and these changes and modifications are to be considered within the protection scope of the present disclosure.

The invention claimed is:

1. A thin film transistor, comprising: a base, and a gate, an active layer, a source and a drain located on the base, wherein the gate comprises a first gate and a second gate which are sequentially provided on the base and are electrically connected to each other; the active layer is located between the first gate and the second gate, and orthographic projections of the first gate and the second gate on the base are partially overlapped with an orthographic projection of the active layer on the base; and the orthographic projections of the first gate and the second gate on the base are partially overlapped with each other, wherein a light-shielding layer is provided on a side of the active layer close to the base, an orthographic projection of the light-shielding layer on the base is at least partially overlapped with the orthographic projection of the active layer on the base; and the light-shielding layer and the first gate are provided in a same layer and are made of a same material, wherein, the orthographic projections of the light-shielding layer and the first gate on the base substantially cover the orthographic projection of the active layer on the base.

2. The thin film transistor of claim 1, wherein a first gate insulating layer is provided between a layer where the first gate is located and a layer where the active layer is located, a second gate insulating layer is provided between the layer where the active layer is located and a layer where the second gate is located, a connection portion is provided on one of the first gate and the second gate, an orthographic projection of the connection portion on the base protrudes from an overlapping region in which the orthographic projections of the first gate and the second gate on the base overlap with each other;

the thin film transistor further comprises a first via hole penetrating through the first gate insulating layer and the second gate insulating layer, and the connection portion electrically connects the first gate with the second gate through the first via hole.

3. A display substrate, comprising pixel units arranged in an array, each of the pixel units comprising the thin film transistor of claim 2.

4. The thin film transistor of claim 1, wherein the active layer comprises a channel region, and a source contact region and a drain contact region respectively provided at both sides of the channel region, and a concentration of ions doped in the source contact region and a concentration of ions doped in the drain contact region are both greater than a concentration of ions doped in the channel region.

5. The thin film transistor of claim 4, wherein the active layer further comprises: a first auxiliary region between the channel region and the source contact region, and a second auxiliary region between the channel region and the drain contact region, orthographic projections of the first auxiliary region and the second auxiliary region on the base are not overlapped with an orthographic projection of the gate on the base, and concentrations of ions doped in the first auxiliary region and the second auxiliary region are smaller than concentrations of ions doped in the source contact region and the drain contact region.

6. The thin film transistor of claim 5, wherein the concentrations of ions doped in the first auxiliary region and the second auxiliary region are greater than or equal to the concentration of ions doped in the channel region.

7. A display substrate, comprising pixel units arranged in an array, each of the pixel units comprising the thin film transistor of claim 5.

8. A display substrate, comprising pixel units arranged in an array, each of the pixel units comprising the thin film transistor of claim 4.

9. A display substrate, comprising pixel units arranged in an array, each of the pixel units comprising the thin film transistor of claim 1.

10. The display substrate of claim 9, wherein a first gate insulating layer is provided between a layer where the first gate is located and a layer where the active layer is located, a second gate insulating layer is provided between the layer where the active layer is located and a layer where the second gate is located, first gates in the pixel units in a same row are connected to form a first gate bar, second gates in the pixel units in the same row are connected to form a second gate bar;

a second via hole penetrating through the first gate insulating layer and the second gate insulating layer is provided between any two pixel units adjacent to each other in a row direction, and the first gate bar and the second gate bar in the pixel units in the same row are connected through second via holes.

11. A VR display device, comprising the display substrate of claim 10.

12. The display substrate of claim 9, wherein a first gate insulating layer is provided between a layer where the first gate is located and a layer where the active layer is located;

a second gate insulating layer is provided between the layer where the active layer is located and a layer where the second gate is located, first gates in the pixel units in a same row are connected to form a first gate bar, second gates in the pixel units in the same row are connected to form a second gate bar;

two ends of each first gate bar in an extension direction in which the first gate bar extends are respectively provided with a second via hole penetrating through the first gate insulating layer and the second gate insulating layer, the first gate bar is connected with the second gate bar, with an orthographic projection on the base being overlapped with that of the first gate bar on the base, through second via holes.

13. A VR display device, comprising the display substrate of claim 12.

14. The display substrate of claim 9, wherein a connection portion is provided on one of the first gate and the second gate, an orthographic projection of the connection portion on the base protrudes from an overlapping region in which the orthographic projections of the first gate and the second gate on the base overlap with each other, the thin film transistor further comprises a first via hole penetrating through the first gate insulating layer and the second gate insulating layer, and the connection portion electrically connects the first gate with the second gate through the first via hole;

any two connection portions adjacent to each other in the row direction are respectively positioned on different sides, in the column direction, of the pixel units where the connection portions are respectively located.

15. A VR display device, comprising the display substrate of claim 14.

16. The display substrate of claim 9, wherein a connection portion is provided on one of the first gate and the second gate, an orthographic projection of the connection portion on the base protrudes from an overlapping region in which the orthographic projections of the first gate and the second gate on the base overlap with each other, the thin film transistor further comprises a first via hole penetrating through the first gate insulating layer and the second gate insulating layer, and the connection portion electrically connects the first gate with the second gate through the first via hole;

the first gate in one of any two pixel units adjacent to each other is provided with the connection portion thereon, and the second gate in the other one of the two adjacent pixel units is provided with the connection portion thereon.

17. A VR display device, comprising the display substrate of claim 16.

18. A VR display device, comprising the display substrate of claim 9.

* * * * *